(12) United States Patent
Chandrahalim et al.

(10) Patent No.: US 11,650,370 B1
(45) Date of Patent: May 16, 2023

(54) METHOD OF EVANESCENTLY COUPLING WHISPERING GALLERY MODE OPTICAL RESONATORS USING LIQUIDS

(71) Applicant: Government of the United States, as represented by the Secretary of the Air Force, Wright-Patterson AFB, OH (US)

(72) Inventors: Hengky Chandrahalim, Beavercreek, OH (US); Kyle T Bodily, Xenia, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 0 days.

(21) Appl. No.: 17/506,854

(22) Filed: Oct. 21, 2021

(51) Int. Cl.
    *G02B 6/293* (2006.01)
(52) U.S. Cl.
    CPC ................................ *G02B 6/29341* (2013.01)
(58) Field of Classification Search
    CPC .................................................. G02B 6/29341
    See application file for complete search history.

(56) References Cited

U.S. PATENT DOCUMENTS

| | | | | |
|---|---|---|---|---|
| 10,234,444 B2* | 3/2019 | Bahl | ..................... | G01N 29/022 |
| 10,529,003 B2* | 1/2020 | Mazed | ................. | G01N 33/551 |
| 10,578,594 B2* | 3/2020 | Tadigadapa | .......... | G01N 33/487 |
| 11,181,454 B2* | 11/2021 | Singh | ................. | G01N 15/0205 |
| 2007/0237460 A1* | 10/2007 | Fan | ..................... | G01N 21/7746 |
| | | | | 385/12 |
| 2011/0045472 A1* | 2/2011 | Gunn III | .............. | G01N 33/574 |
| | | | | 435/6.19 |

FOREIGN PATENT DOCUMENTS

KR    20210021679 A  *  8/2019
WO    WO-2022226508 A1 * 10/2022

OTHER PUBLICATIONS

Rabus, D. G. Integrated Ring Resonators (Springer, 2007) (Year: 2007).*
West, C. D.; "Immersion liquids of high refractive index," Am. Mineral., 1936, vol. 21, No. 4, pp. 245-249.

(Continued)

*Primary Examiner* — Daniel Petkovsek
(74) *Attorney, Agent, or Firm* — AFMCLO/JAZ; James F. McBride

(57) ABSTRACT

The present invention relates to evanescently coupling whispering gallery mode optical resonators having a liquid coupling as well as methods of making and using same. The aforementioned evanescently coupling whispering gallery mode optical resonators having a liquid couplings provide increased tunability and sensing selectivity over current same. The aforementioned. Applicants' method of making evanescent-wave coupled optical resonators can be achieved while having coupling gap dimensions that can be fabricated using standard photolithography. Thus economic, rapid, and mass production of coupled WGM resonators-based lasers, sensors, and signal processors for a broad range of applications can be realized.

19 Claims, 3 Drawing Sheets

(56) References Cited

OTHER PUBLICATIONS

Smietana, M.; Bock, W. J.; Mikulic, P.; Chen, J.; "Pressure Sensing in High-Refractive-Index Liquids Using Long-Period Gratings Nanocoated with Silicon Nitride," Sensors, 2010, vol. 10, No. 12, Art. no. 12.
Van Zwol, P. J.; Palasantzas, G.; "Repulsive Casimir forces between solid materials with high-refractive-index intervening liquids," Phys. Rev. A, 2010, vol. 81, No. 6, p. 062502, doi: 10.1103/PhysRevA.81.062502.
Kayama, Y.; Ichikawa, T.; Ohno, H.; "Transparent and colourless room temperature ionic liquids having high refractive index over 1.60," Chem. Commun., 2014, vol. 50, No. 94, pp. 14790-14792, doi: 10.1039/C4CC06145D.
http://ieexplore.ieee.org/document/7061461/, "Photonic-Molecule single-Mode Laser," 2021.
Shang, L.; Liu, L.; Xu, L.; "Single-frequency coupled asymmetric microcavity laser," Opt. Lett., 2008, vol. 33, No. 10, pp. 1150-1152, doi: 10.1364/OL.33.001150.
Lee, W.; Li, H.; Suter, J. D.; Reddy, K.; Sun, Y.; Fan, X.; "Turnable single mode lasing from an on-chip optofluidic ring resonator laser," Appl. Phys. Lett., 2011, vol. 98, No. 6, p. 061103, doi: 10.1063/1.3554362.
Li, Z.; "Optofluidic coupled micro-ring resonators for biosensing," IEEE International Frequence Control Symposium Proceedings, 2012, pp. 1-4, doi: 10.1109/FCS.2012.6243744.
Chandrahalim, H.; Fan, X.; "Reconfigurable Solid-state Dye-doped Polymer Ring Resonator Lasers," Sci. Rep., 2015, vol. 5, No. 1, p. 18310, doi: 10.1038/srep18310.
Zhao, C. Y.; Liao, J. X.; Zhang, L.; "Vernier effect of cascaded dual microring sensor," Pramana, 2018, vol. 91, No. 6, p. 81, doi: 10.1007/s12043-018-1654-6.
Vollmer, F.; Arnold, S.; Keng, D.; "Single virus detection from the reactive shift of a whispering-gallery mode," Proc. Natl Acad. Sci., 2008, vol. 105, No. 52, pp. 20701-20704, doi: 10.1073/pnas.0808988106.
He, L.; Özdemir, Ş. K.; Zhu, J.; Kim, W.; Yang, L.; "Detecting single viruses and nanoparticles using whispering gallery microlasers," Nat. Nanotechnol, 2011, vol. 6, No. 7, pp. 428-432, doi: 10.1038/nnano.2011.99.
Zhu, J.; Özdemir, Ş. K; He, L.; Chen D.-R.; Yang. L.; "Single virus and nanoparticle size spectrometry by whispering-gallery-mode microcavities," Opt. Express, 2011, vol. 19, No. 17, pp. 16195-16206, doi: 10.1364/OE.19.016195.
White, I. M.; Oveys, H.; Fan, X.; "Liquid-core optical ring-resonator sensors," Opt. Lett., 2006, vol. 31, No. 9, pp. 1319-1321, doi: 10.1364/OL.31.001319.
Carmon, T.; Yang, L.; Vahala, K. J.; "Dynamical thermal behavior and thermal self-stability of microcavities," Opt. Express, 2004, vol. 12, No. 20, pp. 4742-4750, doi: 10 1364/OPEX.12.004742.
Ioppolo, T.; Kozhevnikov, M.; Stepaniuk, V.; Ötügen, M. V.; Sheverev, V.; "Micro-optical force sensor concept based on whispering gallery mode resonators," Appl. Opt., 2008, vol. 47, No. 16, pp. 3009-3014, doi: 10.1364/AO.47.003009.
Forstner, S. et al.; "Ultrasensitive Optomechanical Magnetometry," Adv. Mater., 2014, vol. 26, No. 36, pp. 6348-6353, doi: 10.1002/adma.201401144.
Zhu, J. et al.; "On-chip single nanoparticle detection and sizing by mode spliiting in a ultrahigh-Q microresonator," Nat. Photonics, 2010, vol. 4, No. 1, pp. 46-49, doi: 10.1038/nphoton.2009.237.
Shao, L. et al.; "Detection of Single nanoparticles and Lentiviruses Using Microcavity Resonance Broadening," Adv. Mater., 2013, vol. 25, No. 39, pp. 5616-5620, doi: 10.1002/adma201302572.
Swaim, J. D.; Knittel, J.; Bowen, W. P.; "Detection of nanoparticles with a frequency locked whispering gallery mode microresonator," Appl. Phys. Lett., 2013, vol. 102, No. 18, p. 183106, doi: 10.1063/1.4804243.
Shen, B.-Q. et al.; "Detection of Single Nanoparticles Using the Dissipative Interaction in a High-$Q$ Microcavity," Phys. Rev. Appl., 2016, vol. 5, No. 2, p. 024011, doi: 10.1103/PhysRevApplied.5.024011.
Yu, W.; Jiang, W. C.; Lin, Q.; Lu, T.; "Cavity optomechanical spring sensing of single molecules," Nat. Commun., 2016, vol. 7, No. 1, p. 12311, doi: 10.1038/ncomms12311.
Su, J.; Goldberg, A. F.; Stoltz, B. M.; "Label-free detection of single nanoparticles and biological molecules using microtoroid optical resonators," Light Sci. Appl., 2016, vol. 5, No. 1, pp. e16001-e16001, doi: 10.1038/lsa.2016.1.
Armani, A. M.; Vahala, K. J.; "Heavy water detection using ultra-high-Q microcavities," Opt. Lett., 2006, vol. 31, No. 12, pp. 1896-1898, doi: 10.1364/OL.31.001896.
Chen, W.; Özdemir, Ş. K.; Zhao, G.; Wiersig, J.; Yang, L.; "Exceptional points enhance sensing in an optical microcavity," Nature, 2017, vol. 548, No. 7666, pp. 192-196, doi: 10.1038/nature23281.
Wang, C. et al.; "Electromagnetically induced transparency at a chiral exceptional point," Nat. Phys., 2020, vol. 16, No. 3, pp. 334-340, doi: 10.1038/S41567-019-0746-7.
Miri, M.-A.; Alù, A; "Exceptional points in optics and photonics," Science, 2019, vol. 363, No. 6422, doi: 10.1126/science.aar770.
Weirsig, J.; "Enhancing the Sensitivity of Frequency and Energy Splitting Detection by Using Exceptional Points: Application to Microcavity sensors for Single-Particle Detection," Phys. Rev. Lett., 2014, vol. 112, No. 20, p. 203901, doi: 10.1103/PhysRevLett.112.203901.
Li, B.-B. et al.; "Experimental controlling of Fano resonance in indirectly coupled whispering-gallery microresonators," Appl. Phys. Lett., 2012, vol. 100, No. 2, p. 021108, doi: 10.1063/1.3675571.
Li, B.-B. et al.; "Experimental observation of Fano resonance in a single whispering-gallery microresonator," Appl. Phys. Lett., 2011, vol. 98, No. 2, p. 021116, doi: 10.1063/1.3541884.
Chandrahalim, H.; Chen, Q.; Said, A.; Dugan, M.; Fan, X.; "Monolithic optofluidic ring resonator lasers created by femtosecond laser nanofabrication," Lab Chip, 2015, vol. 15, No. 10, pp. 2335-2340, doi 10.1039/c51c00254k.
Chandrahalim, H.; Rand, S.; Fan, X.; "Fusion of renewable ring resonator lasers and ultrafast laser inscribed photonic waveguides," Sci. Rep., 2016, vol. 6, No. 32668, pp. 1-10, doi: 10.1038/srep32668.
Wan, L.; Chandrahalim, H.; Chen, C.; Chen, Q.; Mei, T.; Oki, Y.; Nishimura, N.; Guo, L.; Fan, X.; "On-chip, high-sensitivity temperature sensors based on dye-doped solid-state polymer microring lasers," Appl. Phys. Lett., 2017, vol. 111, No. 6, pp. 061109, doi: 10.1063/1.4986825.
Chen, C.; Wan, L.; Chandrahalim, H.; Zhou, J.; Zhang, H.; Cho, S.; Mei, T.; Yoshioka, H.; Tian, H. Nishimura, N.; Fan, X.; Guo, L.; Oki, Y.; "Effects of edge inclination angles on whispering-gallery modes in printable wedge microdisk lasers," Opt. Express, 2018, vol. 26, No. 1, pp. 233-241, doi: 10.1364/0E.26.000233.
Wan, L.; Chandrahalim, H.; Zhou, J.; Li, Z.; Chen, C.; Cho, S.; Zhang, H.; Mei, T.; Tian, H.; Oki, Y. Nishimura, N.; Fan, X.; Guo, L.; "Demonstration of versatile whispering-gallery micro-lasers for remote refractive index sensing," Opt. Express, 2018, vol. 26, No. 5, pp. 5800-5809, doi: 10.1364/OE.26.005800.
Chen, C.; Yuan, J.; Wan, L.; Chandrahalim, H.; Chen, Z.; Nishimura, N.; Takeda, H.; Yoskioka, H.; Liu, W.; Oki, Y.; Fan, X.; Li, Z.; "Demonstration of on-chip quantum dots microcavity lasers in a molecularly engineered annular groove," Opt. Lett, 2019, vol. 44, No. 3, pp. 495-498, doi: 10.1364/OL.44.000495.
Chandrahalim, H.; Chen, Q.; Said, A.; Dugan, M.; Bado, P.; Fan, X.; "Optofludic ring cavity lasers fabricated by 3-D femtosecond laser writing technology," Frontiers in Optics (FIO)/Laser Science (LS), 2015, vol. XXXI, pp. JTu4A.64, doi: 10.1364/FIO.2015.JTu4A.64.
Chandrahalim, H.; Fan, X.; "Monolithically integrated ring resonator systems on-chip," Conference on Lasers and Electro-Optics (CLEO), 2017, pp. JTh4M.1, doi: 10.1364/CLEO_AT.2017.JTh4M.1.
Chandrahalim, H.; Rand, S.; Fan, X.; "Refillable and reconfigurable dye-doped ring lasers," Conference on Lasers and Electro-Optics (CLEO), 2017, pp. JTh2A.2, doi: 10.1364/CLEO_AT.2017.JTh2A.2.

(56) References Cited

OTHER PUBLICATIONS

Chandrahalim, H.; Rand, S.; Fan, X.; "Integration of ultrafast laser-inscribed optical waveguides and renewable ring lasers," Conference on Lasers and Electro-Optics (CLEO), 2017, pp. AW4B.5, doi: 10.1364/CLEO_AT.2017.AW4B.5.

Chandrahalim, H.; Fan, X.; "Hybrid fabrication techniques of 3-D integrated microlaser sensors," Advanced Photonics Congress (APC), 2017, pp. SeM2E.1, doi: 10.1364/SENSORS.2017.SeM2E.1.

* cited by examiner

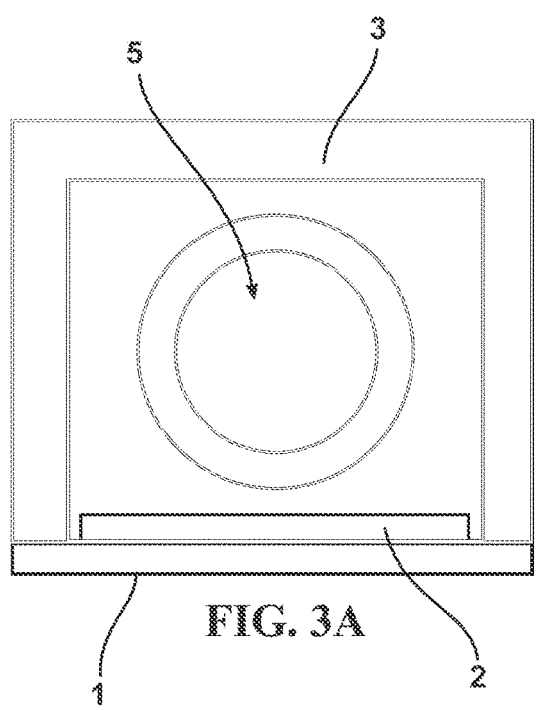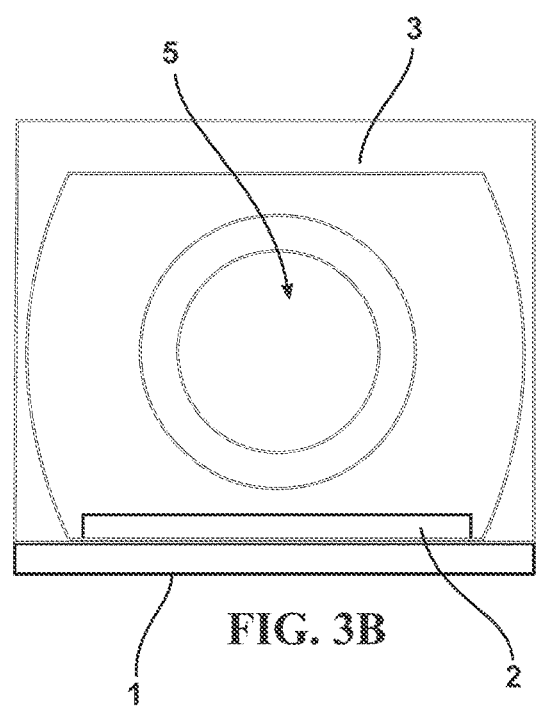
FIG. 3A
FIG. 3B

METHOD OF EVANESCENTLY COUPLING WHISPERING GALLERY MODE OPTICAL RESONATORS USING LIQUIDS

RIGHTS OF THE GOVERNMENT

The invention described herein may be manufactured and used by or for the Government of the United States for all governmental purposes without the payment of any royalty.

FIELD OF THE INVENTION

The present invention relates to evanescently coupling whispering gallery mode optical resonators having a liquid coupling as well as methods of making and using same.

BACKGROUND OF THE INVENTION

Sensing and signal processing with a coherent ultraviolet (UV) light source is of great interest for many applications. One material that has shown promise as a UV coherent light source is zinc oxide (ZnO) with its wide band gap and unique optical properties. UV lasers, sensors, and signal processors can be realized by patterning ZnO films to form whispering gallery mode (WGM) optical resonators. WGM resonators have shown to be very attractive because of their ultrahigh quality factors even when fabricated on a chip. Coupling two WGM resonators to obtain a single mode laser emission (which is necessary for many sensing and spectroscopy applications) is possible through the Vernier effect. However, the required coupling distance between two WGM optical resonators in air is less than 500 nm for near infrared (NIR) wavelengths and less than 100 nm for UV wavelengths. Therefore, the physical construction of the coupling region between resonators must be made using expensive and slow electron beam lithography. This manufacturing barrier has posed a serious challenge to mass produce coupled WGM resonators-based devices and systems. Applicants solved the aforementioned fabrication problem by introducing high refractive index liquids that can be dynamically flown between WGM optical resonators. Using this method, evanescent-wave coupling between optical resonators can be achieved while having coupling gap dimensions that can be fabricated using standard photolithography. Thus economic, rapid, and mass production of coupled WGM resonators-based lasers, sensors, and signal processors for a broad range of applications can be realized.

SUMMARY

The present invention relates to evanescently coupling whispering gallery mode optical resonators having a liquid coupling as well as methods of making and using same. The aforementioned evanescently coupling whispering gallery mode optical resonators having a liquid couplings provide increased tunability and sensing selectivity over current same. The aforementioned. Applicants' method of making evanescent-wave coupled optical resonators can be achieved while having coupling gap dimensions that can be fabricated using standard photolithography. Thus economic, rapid, and mass production of coupled WGM resonators-based lasers, sensors, and signal processors for a broad range of applications can be realized.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 3A depicts a cut away view of the evanescently coupling whispering gallery mode optical resonator having a liquid coupling comprising a substrate 1 comprising whispering gallery mode optical resonators 2, liquid host 3 and liquid outlet 5.

FIG. 3B depicts a cut away view of the evanescently coupling whispering gallery mode optical resonator having a liquid coupling comprising a substrate 1 comprising whispering gallery mode optical resonators 2, liquid host 3 having curved side walls and liquid outlet 5.

Figure 1:
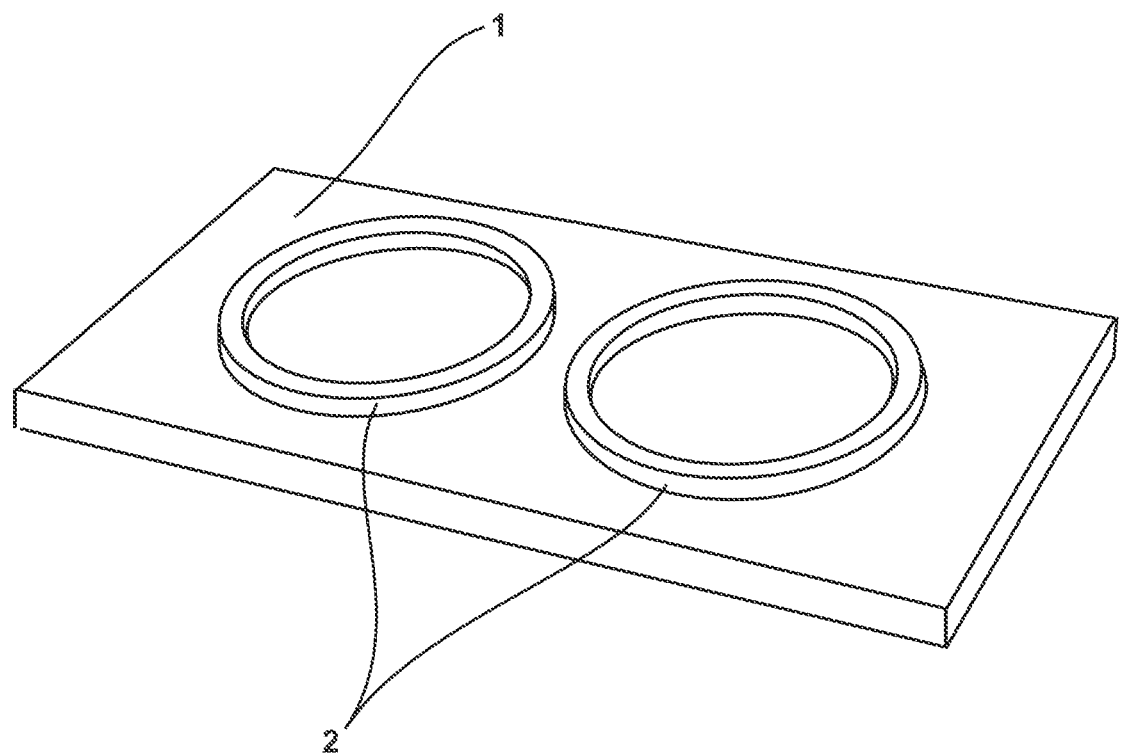
FIG. 1 depicts a substrate 1 comprising whispering gallery mode optical resonators 2.
Figure 2:
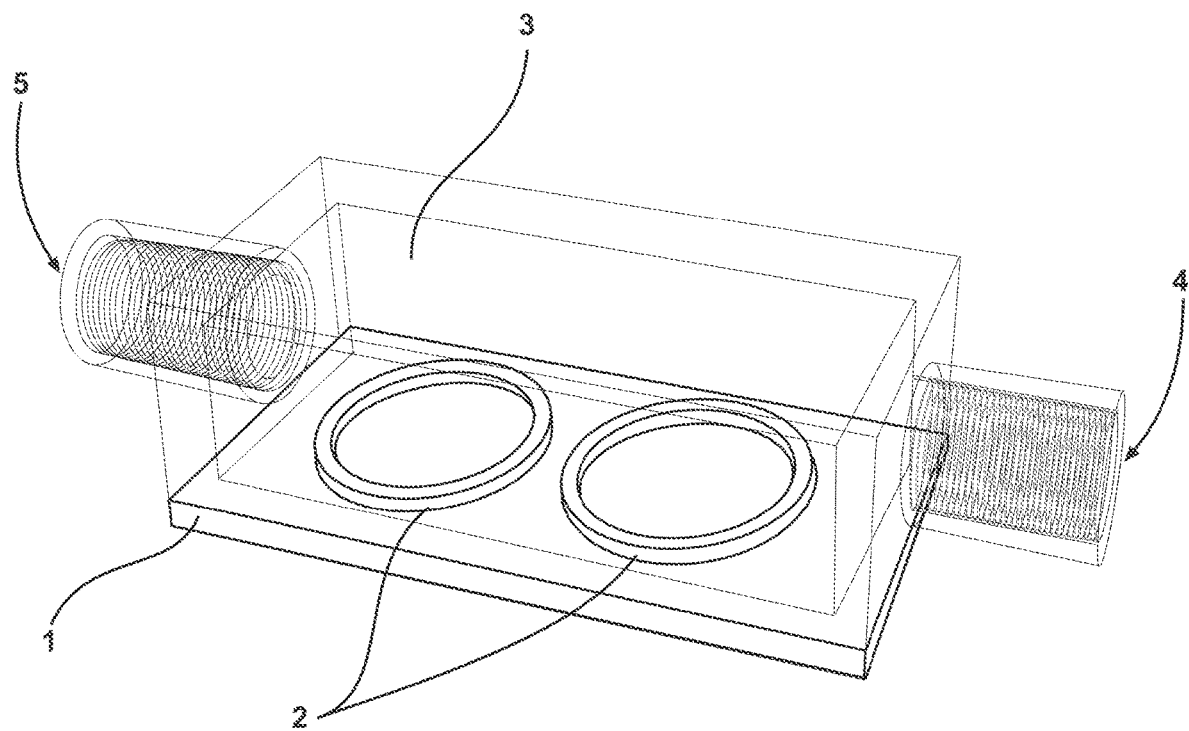
FIG. 2 depicts an evanescently coupling whispering gallery mode optical resonator having a liquid coupling comprising a substrate 1 comprising whispering gallery mode optical resonators 2, liquid host 3, liquid inlet 4 and liquid outlet 5.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Definitions

Unless specifically stated otherwise, as used herein, the terms "a", "an" and "the" mean "at least one".

As used herein, the terms "include", "includes" and "including" are meant to be non-limiting.

As used herein, the words "about," "approximately," or the like, when accompanying a numerical value, are to be construed as indicating a deviation as would be appreciated by one of ordinary skill in the art to operate satisfactorily for an intended purpose.

As used herein, the words "and/or" means, when referring to embodiments (for example an embodiment having elements A and/or B) that the embodiment may have element A alone, element B alone, or elements A and B taken together.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

Evanescently Coupling Whispering Gallery Mode Optical Resonators Having a Liquid Coupling and Device and Articles Comprising Same For purposes of this specification, headings are not considered paragraphs and thus this paragraph is paragraph eighteen of the present specification. The individual number of each paragraph above and below this paragraph can be determined by reference to this paragraph's number. In this paragraph eighteen, Applicants disclose an evanescently coupling whispering gallery mode optical resonators having a liquid coupling comprising:
   a) a substrate having a top and a bottom side and a refractive index;
   b) two or more patterns each pattern being separated from each other by a gap of about 10 nanometers to about 2 microns, preferably said gap is from about 1 micron to about 2 microns and each pattern independently comprising a film having:
      (i) a refractive index that is at least 0.01% greater than said substrate's refractive index, preferably said film having a refractive index that is at least 0.1% greater than said substrate's refractive index, more preferably said film having a refractive index that is at least 1% greater than said substrate's refractive index,
      (ii) a transparency of at least 60%, preferably said film has a transparency of at least 70%, more preferably said film has a transparency of at least 80% to light having a wavelength of 200 nm to about 2000 nm, preferably to light having a wavelength of 300 nm to about 1500 nm, more preferably to light having a wavelength of 400 nm to about 1500 nm;
   c) at least one fluid host comprising at least one fluid cavity, said at least one fluid cavity comprising a ceiling and sides, said ceiling being flat, said at least one fluid cavity comprising a liquid, each fluid host having a transparency of at least 50%, preferably each said fluid host has a transparency of at least 70%, more preferably each said fluid host has a transparency of at least 80% to light having a wavelength of 200 nm to about 2000 nm, preferably to light having a wavelength of 300 nm to about 1500 nm, more preferably to light having a wavelength of 400 nm to about 1500 nm; and each liquid having a transparency of at least 50%, preferably each said liquid has a transparency of at least 70%, more preferably each said liquid has a transparency of at least 80% to light having a wavelength of 200 nm to about 2000 nm, preferably to light having a wavelength of 300 nm to about 1500 nm, more preferably to light having a wavelength of 400 nm to about 1500 nm and a refractive index that is at least 0.01% lower than said film's refractive index, preferably said liquid has a refractive index that is at least 1% lower than said film's refractive index;

at least a pair of said two or more patterns being disposed on one side of said substrate, said at least one liquid host being disposed over at least said pair of said two or more patterns such that, said liquid in said fluid host's fluid cavity puts said pair of patterns in liquid communication. To be clear, each fluid cavity in each fluid host comprises a flat roof.

Applicants disclose the evanescently coupling whispering gallery mode optical resonators having a liquid coupling of paragraph eighteen wherein:
   a) said substrate comprises a material selected from the group consisting of fused-silica, quartz, silicon, and sapphire wafer, preferably said substrate comprises a material selected from the group consisting of fused-silica, quartz, and sapphire wafer more preferably said substrate comprises a material selected from the group consisting of fused-silica;
   b) said film comprises a material selected from the group consisting of transparent dielectric films and light emitting films, preferably said film comprises a material selected from the group consisting of transparent dielectric films and light emitting films that operate from 300 nm to 2000 nm wavelength range, for example, silicon nitride, silicon dioxide, zinc oxide, alumina, rare-earth-doped alumina, aluminum nitride, and gallium nitride, more preferably said film comprises a material selected from the group consisting of transparent dielectric films and light emitting films that operate from 600 nm to 1600 nm wavelength range, most preferably said film comprises silicon nitride, silicon dioxide, alumina, rare-earth-doped alumina, and/or group III-V compound semiconductor materials. All transparent dielectric films and light emitting films can be deposited in the standard semiconductor cleanroom laboratory, for example AFRL, Intel, IBM, TSMC cleanroom laboratories.
   c) said fluid host comprises a material selected from the group consisting of transparent polymers, borosilicate, fused-silica, quartz, preferably said fluid host comprises a material selected from the group consisting of fused-silica, quartz, more preferably said fluid host comprises a material selected from the group consisting of fused-silica; and
   d) said liquid comprises a material selected from the group consisting of an aromatic hydrocarbon, iodomethane, alcohol, and water, preferably said liquid comprises a material selected from the group consisting of alcohol, and water, more preferably said liquid comprises water.

Applicants disclose the evanescently coupling whispering gallery mode optical resonators having a liquid coupling of paragraphs eighteen through nineteen wherein said at least one fluid cavity has at least one fluid inlet and at least one fluid outlet.

Applicants disclose the evanescently coupling whispering gallery mode optical resonators having a liquid coupling of paragraphs eighteen through twenty comprising one through 20 pairs of said two or more patterns, preferably said evanescently coupling whispering gallery mode optical resonators having a liquid coupling comprises 10 through 20 pairs of said two or more patterns, more preferably said evanescently coupling whispering gallery mode optical resonators having a liquid coupling comprises 15 through 20 pairs of said two or more patterns.

Applicants disclose the evanescently coupling whispering gallery mode optical resonators having a liquid coupling of paragraphs eighteen through twenty-one comprising one through 6 fluid hosts, preferably said evanescently coupling whispering gallery mode optical resonators having a liquid coupling comprises 2 through 6 fluid hosts, more preferably said evanescently coupling whispering gallery mode optical resonators having a liquid coupling comprises 4 through 6 fluid hosts.

Applicants disclose the evanescently coupling whispering gallery mode optical resonators having a liquid coupling of paragraphs eighteen through twenty-two wherein:
- a.) said two or more patterns are each independently a geometry selected from a ring, disk, triangle, polygon, preferably said two or more patterns are each independently a geometry selected from a ring and a disk, more preferably said two or more patterns are each independently a geometry selected from a ring;
- b.) each said fluid host has, independently, a periphery that is a polygon, circular, triangular, preferably each said fluid host has, independently, a periphery that is, rectangular, or square, more preferably each said fluid host has, independently, a periphery that is rectangular; and
- c.) each said fluid cavity's sides, independently form a polygon, triangle, or said sides are curved, preferably each said fluid cavity has, independently, a geometry that is, rectangular, square, more preferably each said fluid cavity has, independently, t geometry that is rectangular.

Applicants disclose the evanescently coupling whispering gallery mode optical resonators having a liquid coupling of paragraphs eighteen through twenty-three wherein each fluid host independently comprises one to 4 fluid cavities, preferably each fluid host independently comprises one to 3 fluid cavities, more preferably each fluid host independently comprises one to 2 fluid cavities.

Applicants disclose a device comprising the evanescently coupling whispering gallery mode optical resonators having a liquid coupling of paragraphs eighteen through twenty-four, preferably said device is a laser, gas sensor, chemical sensor, biochemical sensor, biological sensor, particle sensor, temperature sensor, force sensor, refractive index sensor, magnetic sensor, inertial sensor or optical signal processor.

Applicants disclose an article comprising the device of paragraph twenty-five, said article being a motor vehicle such as a car, truck or tank, water vehicle such a boat, ship, hovercraft, or submarine, aerospace vehicle, computer, weapon systems, wireless device such as a cell phone or biomedical device.

Process of Making

This paragraph is paragraph twenty-seven of the present specification. In this paragraph twenty-seven, Applicants disclose a process of making evanescently coupling whispering gallery mode optical resonators having a fluid coupling comprising taking a evanescently coupling whispering gallery mode optical resonator device comprising:
- a) a substrate having a top and a bottom side and a refractive index;
- b) two or more patterns each pattern being separated from each other by a gap of about 10 nanometers to about 2 microns, preferably said gap is from about 1 micron to about 2 microns and each pattern independently comprising a film having:
  - (i) a refractive index that is at least 0.01% greater than said substrate's refractive index, preferably said film having a refractive index that is at least 0.1% greater than said substrate's refractive index, more preferably a dielectric film having a refractive index that is at least 1% greater than said substrate's refractive index,
  - (ii) a transparency of at least 60%, preferably said film has a transparency of at least 70%, more preferably said film has a transparency of at least 80% to light having a wavelength of 200 nm to about 2000 nm, preferably to light having a wavelength of 300 nm to about 1500 nm, more preferably to light having a wavelength of 400 nm to about 1500 nm;
- c) at least one fluid host comprising at least one fluid cavity comprising a liquid, each fluid host having a transparency of at least 50%, preferably each said fluid host has a transparency of at least 70%, more preferably each said fluid host has a transparency of at least 80% to light having a wavelength of 200 nm to about 2000 nm, preferably to light having a wavelength of 300 nm to about 1500 nm, more preferably to light having a wavelength of 400 nm to about 1500 nm; and each liquid having a transparency of having a transparency of at least 50%, preferably each said liquid has a transparency of at least 70%, more preferably each said liquid has a transparency of at least 80% to light having a wavelength of 200 nm to about 2000 nm, preferably to light having a wavelength of 300 nm to about 1500 nm, more preferably to light having a wavelength of 400 nm to about 1500 nm and a refractive index that is at least 0.01% lower than said film's refractive index, preferably said liquid has a refractive index that is at least 1% lower than said film's refractive index;

at least a pair of said two or more patterns being disposed on one side of said substrate, said at least one fluid host being disposed over at least said pair of said two or more patterns; and fluid coupling said patterns by introducing into said fluid host's fluid cavity a liquid that puts all said patterns in liquid communication.

Applicants disclose the process of paragraph twenty-seven wherein:
- a) said substrate comprises a material selected from the group consisting of fused-silica, quartz, silicon, and sapphire wafer, preferably said substrate comprises a material selected from the group consisting of fused-silica, quartz, and sapphire wafer more preferably said substrate comprises a material selected from the group consisting of fused-silica;
- b) said film comprises a material selected from the group consisting of transparent dielectric films and light emitting films, preferably said film comprises a material selected from the group consisting of transparent dielectric films and light emitting films that operate from 500 nm to 2000 nm wavelength range, more preferably said film comprises a material selected from the group consisting of transparent dielectric films and light emitting films that operate from 600 nm to 1600 nm wavelength range; preferably said film is a dielectric film that operates from 600 nm to 1600 nm wavelength range, most preferably said film comprises silicon nitride, silicon dioxide, alumina, rare-earth-doped alumina, and/or group III-V compound semiconductor materials; All transparent dielectric films and light emitting films can be deposited in the standard semiconductor cleanroom laboratory, for example AFRL, Intel, IBM, TSMC cleanroom laboratories.
- c) said fluid host comprises a material selected from the group consisting of transparent polymers, borosilicate, fused-silica, quartz, preferably said fluid host comprises a material selected from the group consisting of fused-silica, quartz, more preferably said fluid host comprises a material selected from the group consisting of fused-silica; and
- d) said liquid comprises a material selected from the group consisting of an aromatic hydrocarbon, iodomethane, alcohol, and water, preferably said liquid comprises a material selected from the group consisting of alcohol, and water, more preferably said liquid comprises water.

Applicants disclose the process of paragraphs twenty-seven through twenty-eight wherein said evanescently coupling whispering gallery mode optical resonator device's at least one fluid cavity has at least one fluid inlet and at least one fluid outlet.

Applicants disclose the process of paragraphs twenty-five through twenty-nine wherein said evanescently coupling whispering gallery mode optical resonator device comprises one through 20 pairs of said two or more patterns, preferably said evanescently coupling whispering gallery mode optical resonators device comprises 10 through 20 pairs of said two or more patterns, more preferably said evanescently coupling whispering gallery mode optical resonators device comprises 15 through 20 pairs of said two or more patterns.

Applicants disclose the process of paragraphs twenty-seven through thirty wherein said evanescently coupling whispering gallery mode optical resonator device comprises one through 6 fluid hosts, preferably said evanescently coupling whispering gallery mode optical resonator device comprises 2 through 6 fluid hosts, more preferably said evanescently coupling whispering gallery mode optical resonator device comprises 4 through 6 fluid hosts.

Applicants disclose the process of paragraphs twenty-seven through thirty-one wherein said evanescently coupling whispering gallery mode optical resonator device:

a.) said two or more patterns are each independently a geometry selected from a ring, disk, triangle, polygon, preferably said two or more patterns are each independently a geometry selected from a ring and a disk, more preferably said two or more patterns are each independently a geometry selected from a ring;

b.) each said fluid host has, independently, a periphery that is a polygon, circular, triangular, preferably each said fluid host has, independently, a periphery that is, rectangular, or square, more preferably each said fluid host has, independently, a periphery that is rectangular; and c.) each said fluid cavity has, independently, a geometry that is a polygon, circular, triangular, preferably each said fluid cavity has, independently, a geometry that is, rectangular, square, more preferably each said fluid cavity has, independently, a geometry that is rectangular.

Applicants disclose the process of paragraphs twenty-seven through thirty-two wherein for said evanescently coupling whispering gallery mode optical resonator device each fluid host independently comprises one to 4 fluid cavities, preferably each fluid host independently comprises one to 3 fluid cavities, more preferably each fluid host independently comprises one to 2 fluid cavities.

Method of Use

This paragraph is paragraph thirty-four of the present specification. In this paragraph thirty-four, Applicants disclose a method of using an evanescently coupling whispering gallery mode optical resonators having a liquid coupling of paragraphs sixteen through twenty-two comprising:

a) exciting said evanescently coupling whispering gallery mode optical resonators having a liquid coupling's evanescently coupled whispering gallery mode optical resonators to emit a single mode laser, preferably said evanescently coupled whispering gallery mode optical resonators are excited using a pump laser; and b) detecting said single mode laser, preferably said single mode laser is detected using a photodetector. (The evanescently coupled whispering gallery mode cavities will emit single mode laser when excited.)

Applicants disclose the method of paragraph thirty-two wherein a liquid with a refractive index lower that the fluid host is flown through the fluid host.

Applicants disclose the method of paragraphs thirty-four through thirty-five wherein the coupled resonators have a coupling strength between coupled resonators and said coupling strength is tuned in real time by flowing two or more liquids having different refractive indices through said fluid host.

The light that is detected can be used by a device to generate a signal that provides a measured value. Preferably said device is a laser, gas sensor, chemical sensor, biochemical sensor, biological sensor, particle sensor, temperature sensor, force sensor, refractive index sensor, magnetic sensor, inertial sensor and optical signal processor.

The excitation and detection procedure of standard evanescently coupling whispering gallery mode optical resonators have been reported in Hengky Chandrahalim, Qiushu Chen, Ali A. Said, Mark Dugan, and Xudong Fan, "Monolithic optofluidic ring resonator lasers created by femtosecond laser nanofabrication," Lab Chip, 15 (10), 2015, pp. 2335-2340. DOI: 10.1039/c51c00254k; Hengky Chandrahalim and Xudong Fan, "Reconfigurable solid-state dye-doped polymer ring resonator lasers," Sci. Rep., 5, (18310), 2015, pp. 1-8. DOI: 10.1038/srep18310; Hengky Chandrahalim, Stephen C. Rand, and Xudong Fan, "Fusion of renewable ring resonator lasers and ultrafast laser inscribed photonic waveguides," Sci. Rep., 6, (32668), 2016, pp. 1-10. DOI: 10.1038/srep32668; Lei Wan, Hengky Chandrahalim, Cong Chen, Qiushu Chen, Ting Mei, Yuji Oki, Naoya Nishimura, Lingjie Jay Guo, and Xudong Fan, "On-chip, high-sensitivity temperature sensors based on dye-doped solid-state polymer microring lasers," Appl. Phys. Lett., 111 (6), 2017, pp. 061109. DOI: 10.1063/1.4986825; Cong Chen, Lei Wan, Hengky Chandrahalim, Jian Zhou, Hui Zhang, Sangha Cho, Ting Mei, Hiroaki Yoshioka, Huiping Tian, Naoya Nishimura, Xudong Fan, Lingjie Jay Guo, and Yuji Oki, "Effects of edge inclination angles on whispering-gallery modes in printable wedge microdisk lasers," Opt. Express, 26 (1), 2018, pp. 233-241. DOI: 10.1364/OE.26.000233; Lei Wan, Hengky Chandrahalim, Jian Zhou, Zhaohui Li, Cong Chen, Sangha Cho, Hui Zhang, Ting Mei, Huiping Tian, Yuji Oki, Naoya Nishimura, Xudong Fan, and Lingjie Jay Guo, "Demonstration of versatile whispering-gallery micro-lasers for remote refractive index sensing," Opt. Express, 26 (5), 2018, pp. 5800-5809. DOI: 10.1364/OE.26.005800; Cong Chen, Jin Yuan, Lei Wan, Hengky Chandrahalim, Zhenshi Chen, Naoya Nishimura, Harunobu Takeda, Hiroaki Yoshioka, Weiping Liu, Yuji Oki, Xudong Fan, and Zhaohui Li, "Demonstration of on-chip quantum dots microcavity lasers in a molecularly engineered annular groove," Opt. Lett, 44 (3), 2019, pp. 495-498. DOI: 10.1364/OL.44.000495; Hengky Chandrahalim, Qiushu Chen, Ali A. Said, Mark Dugan, Philippe Bado, and Xudong Fan, "Optofluidic ring cavity lasers fabricated by 3-D femtosecond laser writing technology," Frontiers in Optics (FIO)/Laser Science (LS) XXXI, 2015, pp. JTu4A.64. DOI: 10.1364/FIO.2015.JTu4A.64; Hengky Chandrahalim and Xudong Fan, "Monolithically integrated ring resonator systems on-chip," Conference on Lasers and Electro-Optics (CLEO), 2017, pp. JTh4M.1. DOI: 10.1364/CLEO_AT.2017.JTh4M.1; Hengky Chandrahalim, Stephen C. Rand, and Xudong Fan, "Refillable and reconfigurable dye-doped ring lasers," Conference on Lasers and Electro-Optics (CLEO), 2017, pp. JTh2A.2. DOI: 10.1364/

CLEO_AT.2017.JTh2A.2; Hengky Chandrahalim, Stephen C. Rand, and Xudong Fan, "Integration of ultrafast laser-inscribed optical waveguides and renewable ring lasers," Conference on Lasers and Electro-Optics (CLEO), 2017, pp. AW4B.5. DOI: 10.1364/CLEO_AT.2017.AW4B.5; Hengky Chandrahalim and Xudong Fan, "Hybrid fabrication techniques of 3-D integrated microlaser sensors," Advanced Photonics Congress (APC), 2017, pp. SeM2E.1. DOI: 10.1364/SENSORS.2017.SeM2E.1

Test Methods for Refractive Index, Transparency

For purposes of this specification, the refractive indices liquids are measured using a commercially available Mettler Toledo Refracto 30GS Portable Handheld Refractometer. Such instrument is used in accordance with the manufacturer's instructions. Many liquids have refractive indices from 1.32 to 1.65.

Suppliers of high refractive index of liquids such as Fiber Optic Center, Inc., Cargille-Sacher Laboratories Inc., Structure Probe, Inc., and Santolubes provide the measured refractive index values and transparency ranges of their products.

Refractive index values of certain liquids that have high refractive index have been previously measured and published in the following references: C. D. West, "Immersion liquids of high refractive index," Am. Mineral., vol. 21, no. 4, pp. 245-249, Apr. 1936. M. Smietana, W. J. Bock, P. Mikulic, and J. Chen, "Pressure Sensing in High-Refractive-Index Liquids Using Long-Period Gratings Nanocoated with Silicon Nitride," Sensors, vol. 10, no. 12, Art. no. 12, Dec. 2010, doi: 10.3390/s101211301. P. J. van Zwol and G. Palasantzas, "Repulsive Casimir forces between solid materials with high-refractive-index intervening liquids," Phys. Rev. A, vol. 81, no. 6, p. 062502, Jun. 2010, doi: 10.1103/PhysRevA.81.062502 and Y. Kayama, T. Ichikawa, and H. Ohno, "Transparent and colourless room temperature ionic liquids having high refractive index over 1.60," Chem. Commun., vol. 50, no. 94, pp. 14790-14792, 2014, doi: 10.1039/C4CC06145D.

The refractive index of the substrates where whispering gallery mode resonators are fabricated are measured by the suppliers and provided to the customers. Currently known suppliers of the required substrates are WaferPro, University Wafer, MSE Supplies, Sydor Optics, MicroChemicals, Coresix Precision Glass. Rudolph J457 Laboratory Refractometer is a known tool to measure refractive index of materials.

The refractive index of the films that are used to realize whispering gallery mode resonators are measured using a reflectometer or ellipsometer, having the specifications of a Filmetrics F54-XY-200 reflectometer or a Woollam M-2000 ellipsometer as of Sep. 29, 2021, is used to measure the refractive index of the thin films. The Filmetrics F54-XY-200 reflectometer is supplied by Filmetrics of 83 West Bldg., #83, West Ave, San Francisco del Monte, Quezon City, Philippines and the Woollam M-2000 ellipsometer is supplied by 645 M St Suite #102, Lincoln, Nebr., USA.

The transparency of films, the liquid host and any liquid is measured by transmission spectroscopy. A laser having the following specifications is used as the light source in the transmission spectroscopy:
  Wavelength
    Signal 405 nm to 710 nm
    Idler 710 nm to 2600 nm
    SH and SF 210 nm to 405 nm
    DUV 192 nm to 210 nm
  Pulse Energy
    OP 15 mJ to 10 mJ
    SH and SF measured at 260 nm 1.8 mJ to 1.3 mJ
    DUV 0.25 mJ to 0.15 mJ A NT230-50 and NT230-100 Nanosecond Tunable Laser from EKSPLA of Savanoriu AV. 237, LT-02300 Vilnius, Lithuania where found to be acceptable light sources in the transmission spectroscopy. Light from the laser is collimated through lenses and passes through a sample to be registered by a photodetector having a detector range of 400 nm to 2000 nm. When a single photodetector does not have the desired range, a photodetector encompassing the lower part of the detection range can be used for the lower range and a second detector that encompasses the remaining range can be used for the remaining detection range. Applicants found that 918D-SL-OD3R and 918D-IR-OD3R photodetectors covered the desired detection range with the 918D-IR-OD3R photodetector working up to 2000 nm even though manufacture listed the upper range of such detectors as 1800 nm. The photodetector is used to measure the output light intensity that passes through the sample. The signal generated by the photodetector is then transmitted to a power meter having the specifications of a 1938-R/2938-R power meter as of Sep. 29, 2021. Such photodetectors and power meter are supplied by Newport Corporation of Irvine Calif. USA. The ratio of the output light intensity to effective input light intensity×100% indicates the transparency of the film under test. The effective input light intensity is the output light intensity measured by the photodetector without a sample being present along the light path.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1. In order to achieve single-mode laser operation, we utilized the Vernier effect, in which two WGM ring cavities of slightly dissimilar sizes hence the free spectral ranges (FSRs) are coupled to each other to suppress the side mode in accordance with "Photonic-Molecule Single-Mode Laser." http://ieeexplore.ieee.org/document/7061461/(accessed Aug. 31, 2021); L. Shang, L. Liu, and L. Xu, "Single-frequency coupled asymmetric microcavity laser," Opt. Lett., vol. 33, no. 10, pp. 1150-1152, May 2008, doi: 10.1364/OL.33.001150; W. Lee, H. Li, J. D. Suter, K. Reddy, Y. Sun, and X. Fan, "Tunable single mode lasing from an on-chip optofluidic ring resonator laser,"Appl. Phys. Lett., vol. 98, no. 6, p. 061103, Feb. 2011, doi: 10.1063/1.3554362; Z. Li, "Optofluidic coupled micro-ring resonators for biosensing," in 2012 IEEE International Frequency Control Symposium Proceedings, May 2012, pp. 1-4. doi: 10.1109/FCS.2012.6243744; H. Chandrahalim and X. Fan, "Reconfigurable Solid-state Dye-doped Polymer Ring Resonator Lasers," Sci. Rep., vol. 5, no. 1, p. 18310, Dec. 2015, doi: 10.1038/srep18310; C. Y. Zhao, J. X. Liao, and L. Zhang, "Vernier effect of cascaded dual microring sensor," Pramana, vol. 91, no. 6, p. 81, Dec. 2018, doi: 10.1007/s12043-018-1654-6. The fabrication process begins with the deposition of 500 nm Zinc Oxide (ZnO) film on a substrate. The substrate can be a fused-silica, quartz, silicon, or sapphire wafer. Once the ZnO film is deposited, the wafer is diced into 1.1 cm×1.1 cm chips using a dicing saw. Once the wafer is diced, a chip sample is then prepared for fabrication. This begins with a 30 second rinse with isopropyl alcohol to clean the sample. Isopropyl alcohol was used instead of the traditional acetone, methanal, DI water process because ZnO dissolves easily in acetone. After the samples are cleaned a layer of MICROPOSIT S1818 photoresist is spun on at a rate of 4000 rpm to reach an average thickness of 1.8 µm. Arrays of coupled rings or disks with slightly different dimensions are patterned using a mask aligner photolithography system. The sample with photoresist is exposed for 3 seconds with 405 nm light. The photoresist is then developed by placing the sample in a 5:1 deionized (DI) water to Microposit 351 developer solution for 30 seconds followed by a 30 second rinse with DI water. The sample is then inspected under an optical microscope for any possible imperfections. Once the photoresist is patterned and developed, the samples are ready to be etched. The arrays of coupled rings or disks made of ZnO film can be etched in a reactive ion etcher or using wet chemicals. After etching the ZnO layer, the leftover photoresist is removed using oxygen plasma. The fabricated chip is then mounted to the fluidic host. Upon excitation with 325 nm wavelength laser the device will emit a coherent light at around 390 nm wavelength.

The fabricated laser of Example 1 can be excited with 325 nm wavelength laser to emit a coherent light at around 390 nm wavelength. The emitted single-mode laser can be used to identify a single virus per the protocol found in the following references: F. Vollmer, S. Arnold, and D. Keng, "Single virus detection from the reactive shift of a whispering-gallery mode,"*Proc. Natl. Acad. Sci.*, vol. 105, no. 52, pp. 20701-20704, Dec. 2008, doi: 10.1073/pnas.0808988106; L. He, Ş.. K. Özdemir, J. Zhu, W. Kim, and L. Yang, "Detecting single viruses and nanoparticles using whispering gallery microlasers,"*Nat. Nanotechnol.*, vol. 6, no. 7, pp. 428-432, Jul. 2011, doi: 10.1038/nnano.2011.99; J. Zhu, Ş.. K. Özdemir, L. He, D.-R. Chen, and L. Yang, "Single virus and nanoparticle size spectrometry by whispering-gallery-mode microcavities," *Opt. Express*, vol. 19, no. 17, pp. 16195-16206, Aug. 2011, doi: 10.1364/OE.19.016195.

The fabricated laser in Example 1 can be excited with 325 nm wavelength laser to emit a coherent light at around 390 nm wavelength. The emitted single-mode laser can be used to identify refractive index changes surrounding the device per the protocol found in the following reference: I. M. White, H. Oveys, and X. Fan, "Liquid-core optical ring-resonator sensors," *Opt. Lett.*, vol. 31, no. 9, pp. 1319-1321, May 2006, doi: 10.1364/OL.31.001319.

The fabricated laser in Example 1 can be excited with 325 nm wavelength laser to emit a coherent light at around 390 nm wavelength. The emitted single-mode laser can be used to detect changes in physical parameters surrounding the device, such as heat per the protocol found in the following reference: T. Carmon, L. Yang, and K. J. Vahala, "Dynamical thermal behavior and thermal self-stability of microcavities," *Opt. Express*, vol. 12, no. 20, pp. 4742-4750, Oct. 2004, doi: 10.1364/OPEX.12.004742, pressure/force per the protocol found in the following reference: T. Ioppolo, M. Kozhevnikov, V. Stepaniuk, M. V. Ötügen, and V. Sheverev, "Micro-optical force sensor concept based on whispering gallery mode resonators,"*Appl. Opt.*, vol. 47, no. 16, pp. 3009-3014, Jun. 2008, doi: 10.1364/AO.47.003009 and magnetic fields per the protocol found in the following reference: [S. Forstner et al., "Ultrasensitive Optomechanical Magnetometry,"*Adv. Mater.*, vol. 26, no. 36, pp. 6348-6353, 2014, doi: 10.1002/adma.201401144.

The fabricated laser in Example 1 can be excited with 325 nm wavelength laser to emit a coherent light at around 390 nm wavelength. The emitted single-mode laser can be used to detect nanoparticles per the protocol found in the following references: J. Zhu et al., "On-chip single nanoparticle detection and sizing by mode splitting in an ultrahigh-Q microresonator," *Nat. Photonics*, vol. 4, no. 1, pp. 46-49, Jan. 2010, doi: 10.1038/nphoton.2009.237; L. Shao et al., "Detection of Single Nanoparticles and Lentiviruses Using Microcavity Resonance Broadening,"*Adv. Mater.*, vol. 25, no. 39, pp. 5616-5620, 2013, doi: 10.1002/adma201302572; J. D. Swaim, J. Knittel, and W. P. Bowen, "Detection of nanoparticles with a frequency locked whispering gallery mode microresonator,"*Appl. Phys. Lett.*, vol. 102, no. 18, p. 183106, May 2013, doi: 10.1063/1.4804243; B.-Q. Shen et al., "Detection of Single Nanoparticles Using the Dissipative Interaction in a High-\$Q\$ Microcavity," *Phys. Rev.* Appl., vol. 5, no. 2, p. 024011, Feb. 2016, doi: 10.1103/PhysRevApplied.5.024011.

The fabricated laser in Example 1 can be excited with 325 nm wavelength laser to emit a coherent light at around 390 nm wavelength. The emitted single-mode laser can be used to identify biological molecules per the protocol found in the following references: W. Yu, W. C. Jiang, Q. Lin, and T. Lu, "Cavity optomechanical spring sensing of single molecules," *Nat. Commun.*, vol. 7, no. 1, p. 12311, Jul. 2016, doi: 10.1038/ncomms12311; J. Su, A. F. Goldberg, and B. M. Stoltz, "Label-free detection of single nanoparticles and biological molecules using microtoroid optical resonators," *Light Sci. Appl.*, vol. 5, no. 1, pp. e16001-e16001, Jan. 2016, doi: 10.1038/lsa.2016.1.

The fabricated laser in Example 1 can be excited with 325 nm wavelength laser to emit a coherent light at around 390 nm wavelength. The emitted single-mode laser can be used to detect heavy water per the protocol found in the following reference: A. M. Armani and K. J. Vahala, "Heavy water detection using ultra-high-Q microcavities," *Opt. Lett.*, vol. 31, no. 12, pp. 1896-1898, Jun. 2006, doi: 10.1364/OL.31.001896.

The fabricated laser in Example 1 can be used to study other fundamental phenomena in physics per the protocol found in the following references: W. Chen, Ş.. Kaya Özdemir, G. Zhao, J. Wiersig, and L. Yang, "Exceptional points enhance sensing in an optical microcavity,"*Nature*, vol. 548, no. 7666, pp. 192-196, Aug. 2017, doi: 10.1038/nature23281; C. Wang et al., "Electromagnetically induced transparency at a chiral exceptional point," *Nat. Phys.*, vol. 16, no. 3, pp. 334-340, Mar. 2020, doi: 10.1038/s41567-019-0746-7; M.-A. Miri and A. Alù, "Exceptional points in optics and photonics," Science, vol. 363, no. 6422, Jan. 2019, doi: 10.1126/science.aar7709; J. Wiersig, "Enhancing the Sensitivity of Frequency and Energy Splitting Detection by Using Exceptional Points: Application to Microcavity Sensors for Single-Particle Detection," *Phys. Rev. Lett.*, vol. 112, no. 20, p. 203901, May 2014, doi: 10.1103/PhysRevLett.112.203901; B.-B. Li et al., "Experimental controlling of Fano resonance in indirectly coupled whispering-gallery microresonators," Appl. *Phys. Lett.*, vol. 100, no. 2, p. 021108, Jan. 2012, doi: 10.1063/1.3675571; B.-B. Li et al., "Experimental observation of Fano resonance in a single whispering-gallery microresonator," Appl. *Phys. Lett.*, vol. 98, no. 2, p. 021116, Jan. 2011, doi: 10.1063/1.3541884.

Every document cited herein, including any cross-referenced or related patent or application and any patent application or patent to which this application claims priority or benefit thereof, is hereby incorporated herein by reference in its entirety unless expressly excluded or otherwise limited.

The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. An evanescently coupling whispering gallery mode optical resonator device having a liquid coupling comprising:
   a) a substrate having a top and a bottom side and a refractive index;
   b) two or more patterns, each pattern being separated from an adjacent pattern by a gap of about 10 nanometers to about 2 microns, and each pattern independently comprising a film having:
      a refractive index that is at least 0.01% greater than said substrate's refractive index;
      (ii) a transparency of at least 60% to light having a wavelength of 200 nm to about 2000 nm;
   c) at least one fluid host comprising at least one fluid cavity, said at least one fluid cavity comprising a ceiling and sides, said ceiling being flat, said at least one fluid cavity comprising a liquid, each fluid host having a transparency of at least 50% to light having a wavelength of 200 nm to about 2000 nm; and
   said liquid in said at least one fluid cavity having a transparency of at least 50% to light having a wavelength of 200 nm to about 2000 nm and a refractive index that is at least 0.01% lower than the refractive index of said film;
   at least a pair of said two or more patterns being disposed on one side of said substrate, said at least one liquid host being disposed over at least said pair of said two or more patterns such that, said liquid in the fluid cavity of said fluid host places said pair of patterns in liquid communication, said patterns being liquid coupled as a result of said liquid communication.

2. The evanescently coupling whispering gallery mode optical resonator device having a liquid coupling of claim 1 wherein:
   a) said substrate comprises a material selected from the group consisting of fused-silica, quartz, silicon, and sapphire wafer;
   b) said film comprises a material selected from the group consisting of transparent dielectric films and light emitting films,
   c) said fluid host comprises a material selected from the group consisting of transparent polymers, borosilicate, fused-silica, quartz; and
   d) said liquid comprises a material selected from the group consisting of an aromatic hydrocarbon, iodomethane, alcohol, and water.

3. The evanescently coupling whispering gallery mode optical resonator device having a liquid coupling of claim 1 wherein said at least one fluid cavity has at least one fluid inlet and at least one fluid outlet.

4. The evanescently coupling whispering gallery mode optical resonator device having a liquid coupling of claim 1 comprising 1 through 20 pairs of said two or more patterns.

5. The evanescently coupling whispering gallery mode optical resonator device having a liquid coupling of claim 1 comprising 1 through 6 fluid hosts.

6. The evanescently coupling whispering gallery mode optical resonator device having a liquid coupling of claim 1 wherein:
   a.) said two or more patterns are each independently a geometry selected from a ring, disk, triangle, polygon;
   b.) each said fluid host has, independently, a periphery that is a polygon, circular, or triangular; and
   c.) each said fluid cavity's sides, independently, form a polygon, triangle, or said sides are curved.

7. The evanescently coupling whispering gallery mode optical resonator device having a liquid coupling of claim 1 wherein each fluid host independently comprises one to 4 fluid cavities.

8. A device comprising the evanescently coupling whispering gallery mode optical resonator device having a liquid coupling of claim 1 said device being a laser, gas sensor, chemical sensor, biochemical sensor, biological sensor, particle sensor, temperature sensor, force sensor, refractive index sensor, magnetic sensor, inertial sensor or optical signal processor.

9. An article comprising the device of claim 8, said article being a motor vehicle, a water vehicle, an aerospace vehicle, computer, weapon systems, wireless device or biomedical device.

10. A process of making an evanescently coupling whispering gallery mode optical resonator device having a fluid coupling comprising taking the evanescently coupling whispering gallery mode optical resonator device that comprises:
   a) a substrate having a top and a bottom side and a refractive index;
   b) two or more patterns, each pattern being separated from an adjacent pattern by a gap of about 10 nanometers to about 2 microns and each pattern independently comprising a film having:
      (i) a refractive index that is at least 0.01% greater than the refractive index of said substrate,
      (ii) a transparency of at least 60% to light having a wavelength of 200 nm to about 2000 nm;
   c) at least one fluid host comprising at least one fluid cavity comprising a liquid, each fluid host having a transparency of at least 50% to light having a wavelength of 200 nm to about 2000 nm; and
   said liquid in said at least one fluid cavity having a transparency of having a transparency of at least 50% to light having a wavelength of 200 nm to about 2000 nm and a refractive index that is at least 0.01% lower than the refractive index of said film;
   at least a pair of said two or more patterns being disposed on one side of said substrate, said at least one fluid host being disposed over at least said pair of said two or more patterns; and
   fluid coupling said patterns by introducing into the fluid cavity of said fluid host a liquid that places all said patterns in liquid communication.

11. The process of making of claim 10 wherein:
a) said substrate comprises a material selected from the group consisting of fused-silica, quartz, silicon, and sapphire wafer;
b) said film comprises a material selected from the group consisting of transparent dielectric films and light emitting films;
c) said fluid host comprises a material selected from the group consisting of transparent polymers, borosilicate, fused-silica, quartz; and
d) said liquid comprises a material selected from the group consisting of an aromatic hydrocarbon, iodomethane, alcohol, and water.

12. The process of making of claim 10 wherein said at least one fluid cavity of the evanescently coupling whispering gallery optical resonator device has at least one fluid inlet and at least one fluid outlet.

13. The process of making of claim 10 wherein said evanescently coupling whispering gallery mode optical resonator device comprises 1 through 20 pairs of said two or more patterns.

14. The process of making of claim 10 wherein said evanescently coupling whispering gallery mode optical resonator device comprises 1 through 6 fluid hosts.

15. The process of making of claim 10 wherein said evanescently coupling whispering gallery mode optical resonator device:
a.) said two or more patterns are each independently a geometry selected from a ring, disk, triangle, polygon;
b.) each said fluid host has, independently, a periphery that is a polygon, circular, or triangular; and
c.) each said fluid cavity has, independently, a geometry that is a polygon, circular, or triangular.

16. The process of making of claim 10 wherein for said evanescently coupling whispering gallery mode optical resonator device each fluid host independently comprises 1 to 4 fluid cavities.

17. A method of using the device of claim 1 comprising:
a) exciting said two or more patterns of said device to emit a single mode laser; and
b) detecting said single mode laser.

18. The method of claim 17 wherein a liquid with a refractive index lower that of the fluid host is flowed through the fluid host.

19. The method of claim 17 wherein the coupled patterns have a coupling strength between coupled patterns and said coupling strength is tuned in real time by flowing two or more liquids having different refractive indices through said fluid host.

* * * * *